United States Patent

Kurahashi

[11] Patent Number: 6,083,769
[45] Date of Patent: Jul. 4, 2000

[54] METHOD FOR PRODUCING A LIGHT-EMITTING DIODE

[75] Inventor: Takahisa Kurahashi, Kashiba, Japan

[73] Assignee: Sharp Kabushiki Kaisha, Osaka, Japan

[21] Appl. No.: 09/406,783

[22] Filed: Sep. 28, 1999

[30] Foreign Application Priority Data

Sep. 29, 1998 [JP] Japan .................................. 10-276139

[51] Int. Cl.$^7$ ................................................ H01L 21/00
[52] U.S. Cl. ................................ 438/33; 438/34; 438/42; 438/46
[58] Field of Search ................................ 438/22, 33, 42, 438/46, 47, 34

[56] References Cited

U.S. PATENT DOCUMENTS 4,845,405  7/1989  Yamane et al. ...................... 313/500
5,753,940  5/1998  Komoto ................................ 257/95

FOREIGN PATENT DOCUMENTS 6-326352  11/1994  Japan .

*Primary Examiner*—Wael Fahmy
*Assistant Examiner*—Long Pham

*Attorney, Agent, or Firm*—Nixon & Vanderhye, P.C.

[57] ABSTRACT

A method for producing a light-emitting diode includes the steps of: forming a single-layered or multi-layered $Al_xGa_yIn_{1-x-y}P$ ($0 \leq x \leq 1$, $0 \leq y \leq 1$) light-emitting layer, an $Al_xGa_yIn_{1-x-y}P$ ($0 \leq x \leq 1$, $0 \leq y \leq 1$) intermediate layer of a second conductivity type, and an $Al_xGa_yIn_{1-x-y}P$ ($0 \leq x \leq 1$, $0 \leq y \leq 1$) current diffusion layer of a second conductivity type on a GaAs substrate of a first conductivity type; forming a first electrode of a first conductivity type and a second electrode of a second conductivity type so as to contact the GaAs substrate and the current diffusion layer, respectively; forming a protection film on exposed surfaces of the current diffusion layer and the second electrode; forming grooves by dicing so as to interpose the second electrode and to reach the GaAs substrate; etching the light-emitting layer, the intermediate layer, and the current diffusion layer by 4 $\mu$m or more with a bromine-type etchant from positions each facing the grooves in a direction parallel to a surface of the substrate so as not to reach an end portion of each of the adjacent second electrodes; and removing the protection film formed on the current diffusion layer and the second electrode.

5 Claims, 2 Drawing Sheets

METHOD FOR PRODUCING A LIGHT-EMITTING DIODE

BACKGROUND OF THE INVENTION

1. Field of the Invention

The present invention relates to a method for producing a light-emitting diode to be used for a display device, a transmission device, and the like.

2. Description of the Related Art

In recent years, light-emitting diodes (LEDs) are widely used in optical communications, information display panels, and the like. In a conventional process for forming an LED into chips, dicing is routinely used. However, after a dicing process, strain typically remains on a diced surface of a substrate. If the chip thus formed is molded with resin without eliminating such strain, luminance is reduced during an operation thereof due to the strain. In an extreme case, simply molding the chip with resin may cause visible dark lines or cracks to be formed.

In order to avoid this problem, the following process is conventionally employed: the strained portion of the chip is removed by etching away the diced surface by several micrometers after the substrate is diced, and then the chip is molded with resin.

For example, in the case of a conventional GaP type LED, after dicing a substrate, the diced surface is etched away by about 3 µm with an etchant of sulfuric acid/hydrogen peroxide type. In the case of a conventional AlGaInP type LED in which $Al_xGa_{1-x}As$ ($0 \leq x \leq 1$) is used to form a current diffusing layer, a diced surface is etched away by 2 µm with a mixture of bromine and methanol.

However, in the case of an AlGaInP type LED using an AlGaAs current diffusion layer, when a light emitting wavelength is shortened (e.g., to the range of 550 to 590 nm), light is likely to be absorbed by the current diffusion layer, thereby reducing luminance. In order to reduce such light absorption, a mole fraction of Al in a mixed crystal in the current diffusion layer may be increased. However, under the conditions of high temperature and high humidity, increased Al mole fraction typically deteriorates the reliability of such an LED.

In order to overcome the above problem, GaP which contains no Al and has a larger energy band gap as compared with AlGaAs may be used to form a current diffusion layer. However, GaP has a lattice mismatch of about 3.6% with respect to a GaAs substrate. Thus, when GaP is used for forming the current diffusion layer to be deposited over a GaAs substrate, strain is likely to be generated, after the dicing process, from a diced surface to a deeper portion of an interface between an AlGaInP light-emitting layer (active layer) and the GaP current diffusion layer. As a result, the AlGaInP light-emitting layer (active layer) and the GaP current diffusion layer is required to be etched away to a deeper position from the diced surface in order to prevent a decrease in luminance.

SUMMARY OF THE INVENTION

A method for producing a light-emitting diode of the present invention includes the steps of: forming a single-layered or multi-layered $Al_xGa_yIn_{1-x-y}P$ ($0 \leq x \leq 1$, $0 \leq y \leq 1$) light-emitting layer, an $Al_xGa_yIn_{1-x-y}P$ ($0 \leq x \leq 1$, $0 \leq y \leq 1$) intermediate layer of a second conductivity type, and an $Al_xGa_yIn_{1-x-y}P$ ($0x \leq 1$, $0 \leq y \leq 1$) current diffusion layer of a second conductivity type on a GaAs substrate of a first conductivity type; forming a first electrode of a first conductivity type and a second electrode of a second conductivity type so as to contact the GaAs substrate and the current diffusion layer, respectively; forming a protection film on exposed surfaces of the current diffusion layer and the second electrode; forming grooves by dicing so as to interpose the second electrode and to reach the GaAs substrate; etching the light-emitting layer, the intermediate layer, and the current diffusion layer by 4 µm or more with a bromine-type etchant from positions each facing the grooves in a direction parallel to a surface of the substrate so as not to reach an end portion of each of the adjacent second electrodes; and removing the protection film formed on the current diffusion layer and the second electrode.

The current diffusion layer may be made of GaP.

A multi-layered reflecting film may be provided between the GaAs substrate and the single-layered or multi-layered $Al_xGa_yIn_{1-x-y}P$ light-emitting layer.

The bromine-type etchant may be a mixture containing a bromine aqueous solution and phosphoric acid.

Preferably, a diced width of each of the grooves formed in the dicing step is equal to or greater than about 50 µm.

Thus, the invention described herein makes possible the advantage of providing a method for producing an LED with high luminance, improved reliability, and high efficiency.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative embodiments with reference to the drawings.

Embodiment 1

FIGS. 1A to 1E are cross-sectional views schematically illustrating a process for producing an LED in accordance with Example 1 of the invention. An LED 100 of Embodiment 1 is an AlGaInP type LED having an active layer formed of AlGaInP.

Figure 1A:
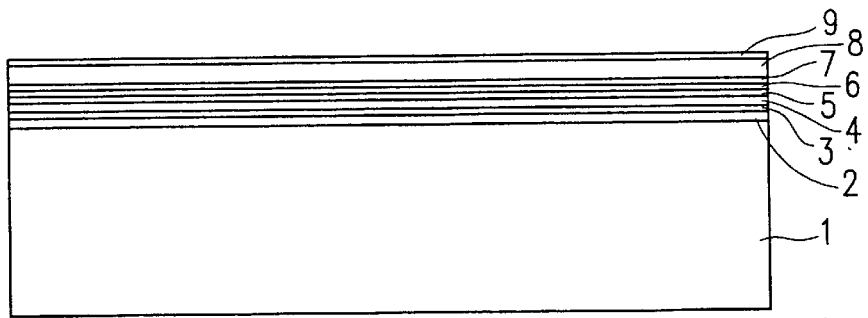
FIGS. 1A to 1E are cross-sectional views illustrating a process for producing an LED in accordance with Example 1 of the present invention.

As shown in FIG. 1A, an n-type GaAs buffer layer 2 (about 1 µm thick), a distributed Bragg reflector (DBR) layer 3 (about 1 µm thick) as a multi-layered reflecting film composed of 10 pairs of n-type $Al_{0.5}In_{0.5}P$ and n-type $(Al_{0.4}Ga_{0.6})_{0.5}In_{0.5}P$, an n-type $Al_{0.5}In_{0.5}P$ first cladding layer 4 (about 1 µm thick), a p-type $(Al_{0.3}Ga_{0.7})_{0.5}In_{0.5}P$ active layer 5 (about 0.5 µm thick), a p-type $Al_{0.5}In_{0.5}P$ second cladding layer 6 (about 1 µm thick), a p-type AlGaInP intermediate layer 7 (about 0.15 µm thick), a p-type GaP current diffusion layer 8 (about 7 µm thick), and a p-type GaAs cap layer 9 (about 0.01 µm thick) are successively formed in this order on an n-type GaAs substrate 1 (about 350 µm thick) by a metal organic chemical vapor deposition (MOCVD) technique.

Figure 1B:
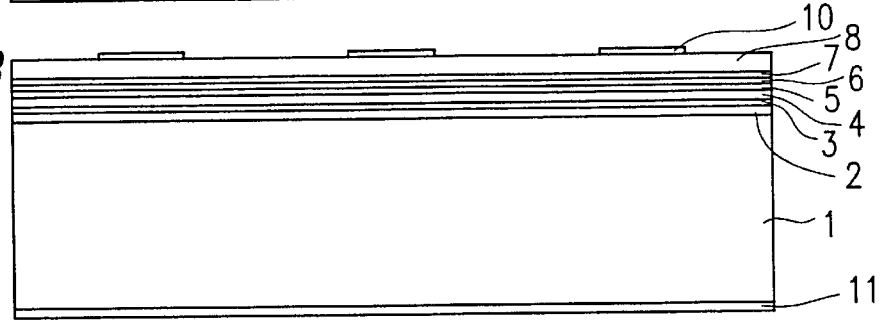

Thereafter, as shown in FIG. 1B, the P-type GaAs cap layer 9 is etched away with an etchant of sulfuric acid/hydrogen peroxide type. A AuBe/Au layer is then deposited on the p-type GaP current diffusion layer 8, and patterned by a photolithography process and an etching process with an Au etchant (e.g., iodine/iodide ammonium type etchant) so as to form patterns of a plurality of surface electrodes each having a diameter of about 120 µm. Then, the substrate with the resultant structure thereon is heat-treated to obtain a plurality of p-type ohmic-contact electrodes 10.

A bottom surface of the GaAs substrate 1 is abraded by a thickness of about 280 µm, and a AuGe/Au layer is deposited on the abraded surface. The substrate 1 is then heat-treated to obtain an n-type ohmic contact electrode 11.

Figure 1C:
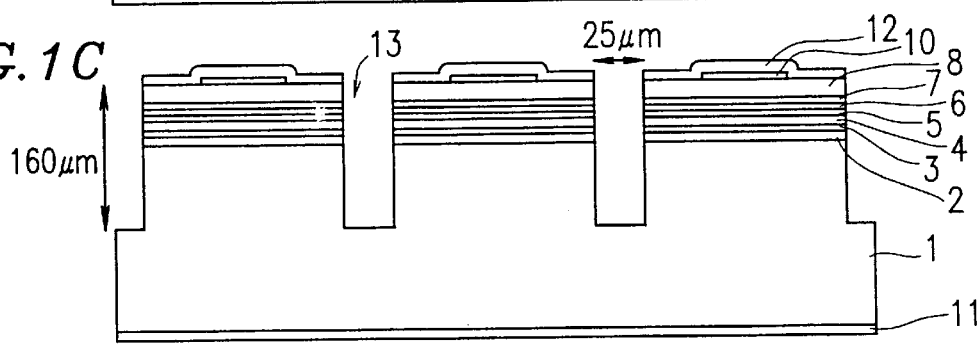

Thereafter, as shown in FIG. 1C, the p-type electrodes 10 and an exposed surface of the p-type GaP current diffusion layer 8 are covered with a photoresist 12, and the resultant structure is attached onto a Si wafer (not shown) with wax (not shown).

Next, equally-spaced grooves 13 with a pitch of about 280 µm, each having a depth of about 160 µm and a width of about 25 µm, are formed by a dicing process, so that each of the diced grooves 13 is positioned between the adjacent p-type electrodes 10. The distance between the p-type electrode 10 and the edge of each adjacent groove 13 is about 67.5 µm.

The wafer with the thus diced structure is then dipped into a bromine-type etchant (temperature: about 30° C.) containing a saturated aqueous solution of bromine dissolved at a temperature of about 30° C., phosphoric acid, and pure water. Thus, a surface of the groove 13 strained by dicing is etched away. Typically, an etched amount on an upper surface of the p-type GaP current diffusion layer 8 (which will be an LED chip surface) is about 8 µm in a direction parallel to the substrate surface. Portions of the underlying layers mentioned below, facing the grooves 13, are etched away by about 5 µm in a direction parallel to the substrate surface: the n-type $Al_{0.5}In_{0.5}P$ first cladding layer 4, the p-type $(Al_{0.3}Ga_{0.7})_{0.5}In_{0.5}P$ active layer 5, the p-type $Al_{0.5}In_{0.5}P$ second cladding layer 6, and the p-type AlGaInP intermediate layer 7.

Figure 1D:
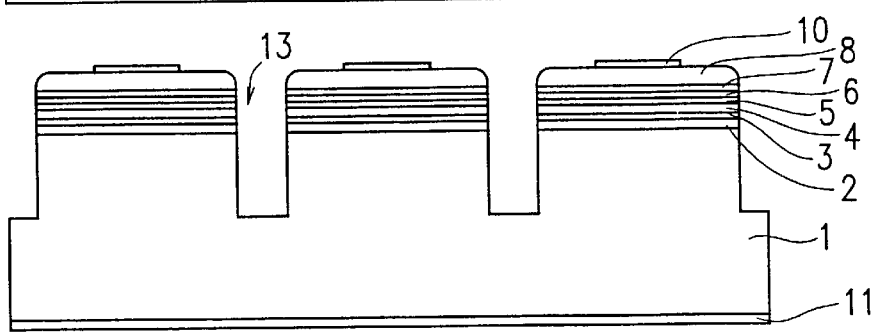
Figure 1E:
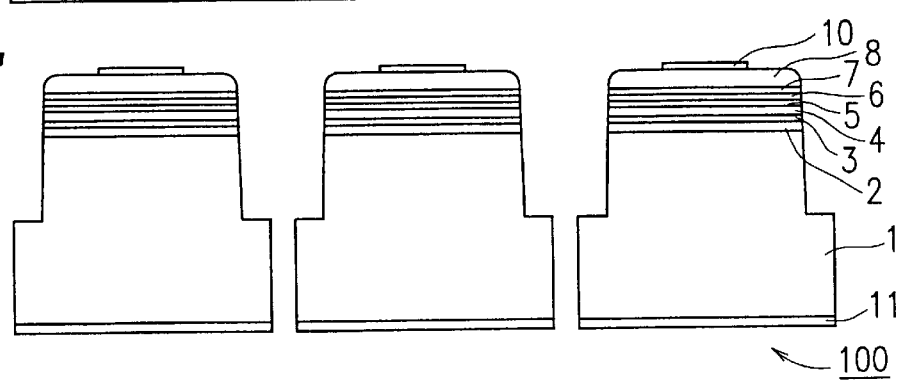

Thereafter, the substrate 1 is detached from the Si wafer (not shown), and the wax (not shown) and the photoresist 12 are removed by washing, as shown in FIG. 1D. Next, as shown in FIG. 1E, the substrate 1 is divided into separate LED chips. As a result, the LED 100 is produced.

In the resultant chip of the LED 100, a distance between the p-type electrode 10 and the edge of each adjacent groove 13 is about 59.5 µm, i.e., about 67.5 µm obtained in the dicing process minus an etched amount of about 8 µm. This distance is sufficient for preventing current leakage otherwise caused when the p-type electrode 10 comes into contact with any n-type layer (e.g., the n-type cladding layer 4).

When conventional LEDs produced by etching the side surfaces of the diced grooves by about 2 µm in accordance with a conventional method are molded with resin, some of these chips show luminous intensity degraded up to about 70% of an initial level thereof after about 500 hours of operation testing under the conditions of an operating current of about 50 mA and an ambient temperature of about –30° C. On the other hand, with the LED 100 of the present embodiment, the maximum degradation level is only about 90% of an initial luminous intensity after about 500 hours of operation testing under the same conditions as described above, thereby exhibiting excellent light-emitting characteristics.

Moreover, in the present embodiment, the p-type current diffusion layer is made of GaP and thus does not contain Al. Therefore, higher moisture resistance is obtained, so that about 90% of the initial luminance intensity is still maintained after about 500 hours of operation testing under the conditions of an ambient temperature of 85° C., an ambient humidity of 90%, and an operating current of 30 mA. In addition, because of a low resistivity of GaP, an operating voltage is as low as about 1.9 volts.

Furthermore, since a multi-layered reflecting film is employed in a chip structure of the present embodiment, it is possible to improve an external light-emitting efficiency.

A mixture containing a saturated aqueous solution of bromine and phosphoric acid is used as an etchant for etching the diced surface, whereby the process which requires handling of a solution of bromine with a high concentration thereof is reduced. Thus, the method of the present invention is safer than a conventional process which uses a mixture of bromine and methanol as the etchant.

Embodiment 2

FIGS. 2A to 2E are cross-sectional views schematically illustrating a process for producing an LED in accordance with Embodiment 2 of the present invention. An LED 200 of the present embodiment is an AlGaInP type LED having an active layer formed of AlGaInP, as in Embodiment 1. A width of each groove to be formed by dicing as well as an amount to be etched away at each of the diced grooves is different from those of Embodiment 1.

Figure 2A:
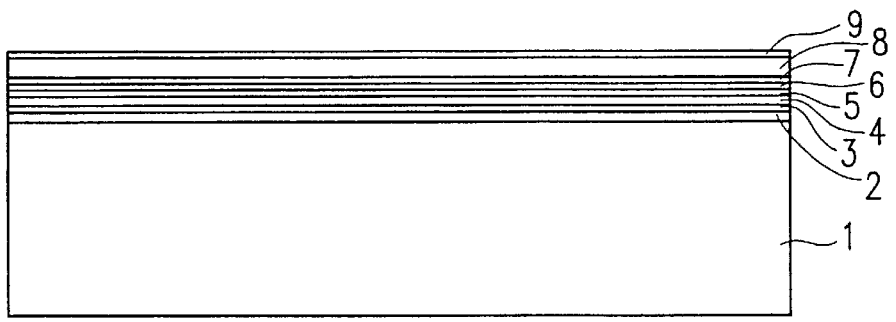
FIGS. 2A to 2E are cross-sectional views illustrating a process for producing an LED in accordance with Example 2 of the present invention.

As shown in FIG. 2A, an n-type GaAs buffer layer 2 (about 1 µm thick), a DBR layer 3 (about 1 µm thick) as a multi-layered reflecting film composed of 10 pairs of n-type $Al_{0.5}In_{0.5}P$ and n-type $(Al_{0.4}Ga_{0.6})_{0.5}In_{0.5}P$, an n-type $Al_{0.5}In_{0.5}P$ first cladding layer 4 (about 1 µm thick), a p-type $(Al_{0.3}Ga_{0.7})_{0.5}In_{0.5}P$ active layer 5 (about 0.5 µm thick), a p-type $Al_{0.5}In_{0.5}P$ second cladding layer 6 (about 1 µm thick), a p-type AlGaInP intermediate layer 7 (about 0.15 µm thick), a p-type GaP current diffusion layer 8 (about 7 µm thick), and a p-type GaAs cap layer 9 (about 0.01 µm thick) are successively formed in this order on an n-type GaAs substrate 1 (about 350 µm) by MOCVD.

Figure 2B:
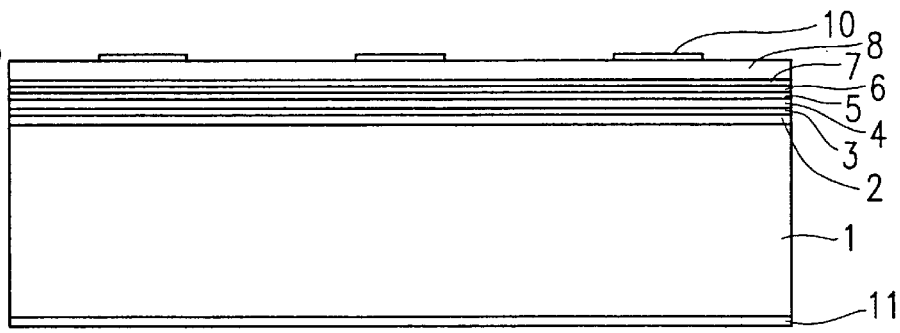

Thereafter, as shown in FIG. 2B, the p-type GaAs cap layer 9 is etched away with an etchant of sulfuric acid/hydrogen peroxide type. A AuBe/Au layer is then deposited on the p-type GaP current diffusion layer 8, and patterned by a photolithography process and an etching process with an Au etchant (e.g., iodine/iodide ammonium type etchant) so as to form patterns of a plurality of surface electrodes each having a diameter of about 120 µm. Then, the substrate with the resultant structure thereon is heat-treated to obtain a plurality of p-type ohmic-contact electrodes 10.

A bottom surface of the GaAs substrate 1 is abraded by a thickness of about 280 µm, and a AuGe/Au layer is deposited on the abraded surface. The substrate 1 is then heat-treated to obtain an n-type ohmic contact electrode 11.

Figure 2C:
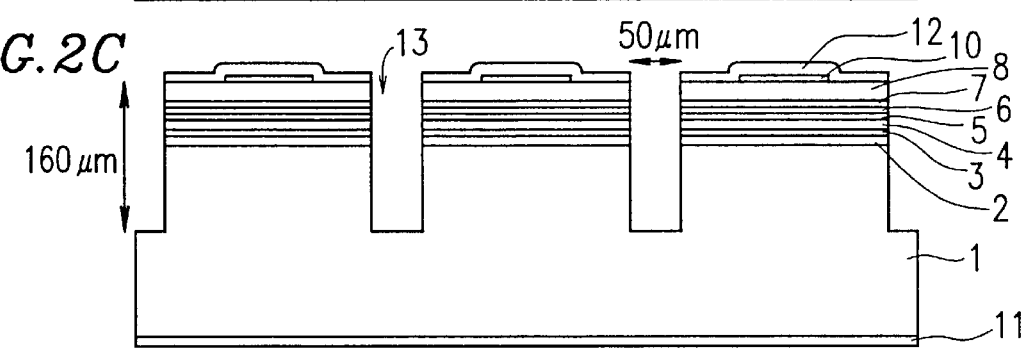

Thereafter, as shown in FIG. 2C, the p-type electrodes 10 and an exposed surface of the p-type GaP current diffusion layer 8 are covered with a photoresist 12, and the resultant structure is attached onto a Si wafer (not shown) with wax (not shown).

Next, equally-spaced grooves 13 with a pitch of about 280 µm, each having a depth of about 160 µm and a width of about 50 µm, are formed by a dicing process, so that each of the diced grooves 13 is positioned between the adjacent p-type electrodes 10. The distance between the p-type electrode 10 and the edge of each adjacent groove is about 55 µm.

The wafer with the thus diced structure is then dipped into a bromine-type etchant (temperature: about 30° C.) containing a saturated aqueous solution of bromine dissolved at a temperature of about 30° C., phosphoric acid, and pure water. Thus, the diced surface of the grooves 13 containing strain due to the dicing process is etched away. Typically, an etched amount on an upper surface of the p-type GaP current diffusion layer 8 (which will be an LED chip surface) is about 6 μm in a direction parallel to the substrate surface. Portions of the underlying layers, as indicated below, facing the grooves 13, are etched by about 5 μm in a direction parallel to the substrate surface: an n-type $Al_{0.5}In_{0.5}P$ first cladding layer 4, a p-type $(Al_{0.3}Ga_{0.7})_{0.5}In_{0.5}P$ active layer 5, a p-type $Al_{0.5}In_{0.5}P$ second cladding layer 6, and a p-type AlGaInP intermediate layer 7.

Figure 2D:
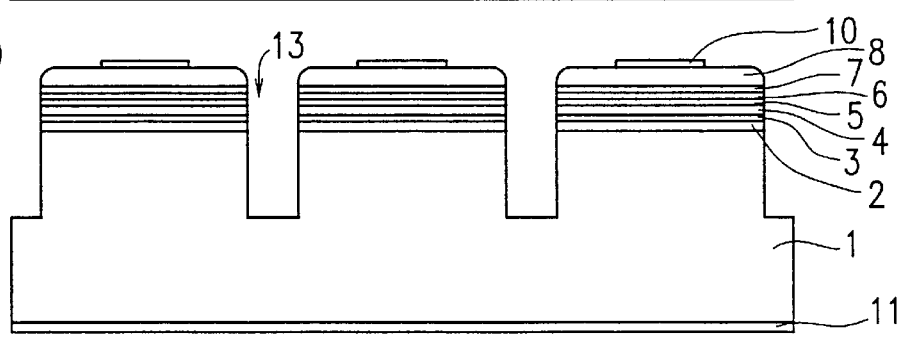
Figure 2E:
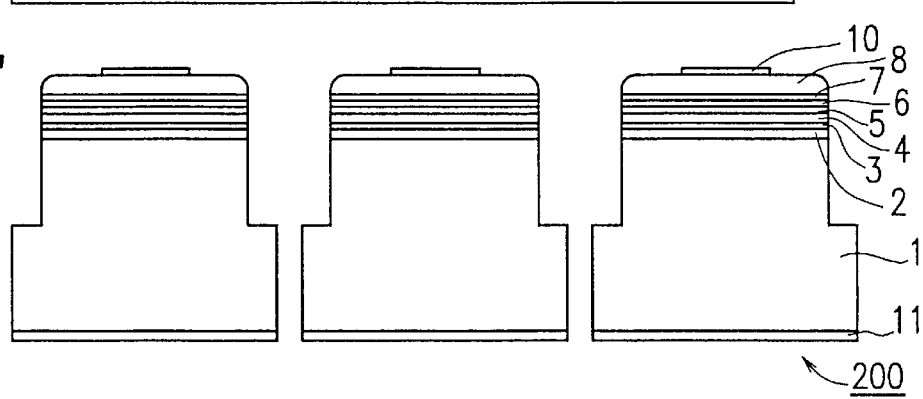

Thereafter, the substrate 1 is detached from the Si wafer (not shown), and the wax (not shown) and the photoresist 12 are removed by washing, as shown in FIG. 2D. Next, as shown in FIG. 2E, the substrate 1 is divided into separate LED chips. As a result, the LED 200 is produced.

In the resultant chip of the LED 200, a distance between the p-type electrode 10 and the edge of each adjacent groove 13 is about 49 μm, i.e., about 55 μm obtained in the dicing process minus an etched amount of about 6 μm. This distance is sufficient for preventing current leakage otherwise caused when the p-type electrode 10 comes into contact with any n-type layer (e.g., the n-type cladding layer 4).

Moreover, a dicing width is set to be relatively wider (i.e., about 50 μm), so that the etchant is likely to reach the bottoms of the diced grooves 13. Thus, in the vicinity of the intermediate layer 7, portions facing to the diced grooves 13 are etched away by a width of about 80% to 90% of the etched amount at the chip surface portion of the current diffusion layer 8 in this embodiment. It should be noted that in Embodiment 1 where the dicing width is set to be about 25 μm, portions of the intermediate layer 7 facing the diced grooves 13 are etched away by a depth of about only 60% to 70% of the etched amount at the chip surface portion of the current diffusion layer 8. Thus, a time period required for the etching in Embodiment 2 is shortened to about ¾, compared with that required in Embodiment 1.

The maximum degradation level is about 90% of the initial luminance intensity after about 500 hours of the operation testing under the conditions of an ambient temperature of 30° C. and an operating current of 50 mA, whereby the LED formed in the present embodiment exhibits excellent light-emitting characteristics.

A composition ratio in each of the light-emitting layer, the intermediate layer, and the current diffusion layer is not limited to those indicated in aforementioned Embodiments 1 and 2. Any other composition ratios can be employed as long as each layer satisfies the composition ratio of $Al_xGa_yIn_{1-x-y}P$ ($0 \leq x \leq 1$, $0 \leq y \leq 1$).

The protection film is not limited to a photoresist layer and may be made of any appropriate material. Preferred materials for the protection film are a photoresist, an $Al_2O_3$ film, a $SiO_2$ film, and the like.

A mixture containing bromine aqueous solution and phosphoric acid is preferred as a bromine-type etchant, and is preferably used at a temperature in the range of about 10° C. to about 30° C.

Electrodes to be formed on a chip surface do not have to be spaced equally from both edges of the grooves to be formed adjacent thereto, and may be placed at any position within the scope of the present invention. Moreover, any number of electrodes may be formed on the substrate.

According to a method for producing an LED of the present invention, a layered structure is diced so as to form grooves each reaching a GaAs substrate of a first conductivity type. Then, portions of the layered structure and the substrate are further etched away from side surfaces of the diced groove in the direction parallel to a surface of the substrate by about 4 μm or more. Therefore, it is possible to sufficiently remove the strained portion, introduced at a time of dicing and caused by a lattice mismatch among a single-layered or multi-layered $Al_xGa_yIn_{1-x-y}P$ light-emitting layer, an $Al_xGa_yIn_{1-x-y}P$ intermediate layer of a second conductivity type, and an $Al_xGa_yIn_{1-x-y}P$ current diffusion layer of a second conductivity type.

In addition, the etching is terminated before reaching an edge of an electrode of a second conductivity type. Accordingly, the electrode of the second conductivity type does not come into contact with a layer of the first conductivity type, thereby preventing current leakage due to the contact therebetween.

By using GaP for a current diffusion layer of a second conductivity type, it is possible to produce an LED with high moisture resistance and a low resistivity, in which the emitted light is not likely to be absorbed by the current diffusion layer.

By disposing a multi-layered reflecting film between the GaAs substrate of the first conductivity type and the single-layered or multi-layered $Al_xGa_yIn_{1-x-y}P$ ($0 \leq x \leq 1$, $0 \leq y \leq 1$) light-emitting layer, it is possible to reflect the emitted light, which travels toward and otherwise absorbed by the GaAs substrate, in a direction of the chip surface (i.e., a direction toward the electrode of the second conductivity from the GaAs substrate). As a result, it is possible to produce a brighter LED with an improved external light emitting efficiency.

By using a mixture of a bromine aqueous solution and phosphoric acid as an etchant for etching the GaAs substrate, the $Al_xGa_yIn_{1-x-y}P$ light-emitting layer and the $Al_xGa_yIn_{1-x-y}P$ current diffusion layer from the side surfaces of the diced grooves, it is possible to have a smaller difference in an etching rate among each layer to be etched, so as to render the side surfaces of the diced grooves flat after the etching. In addition, it is possible to substantially reduce processes which require handling of a hazardous solution of bromine with a high concentration thereof which has high hazardous toxicity, compared with the case where the bromine methanol mixture is used as an etchant, whereby safety at a time of the production can be enhanced.

By prescribing a groove width at about 50 μm or more, the etchant is likely to reach a deeper portion of the groove during the subsequent etching process. As a result, it is possible to reduce time required to etch the $Al_xGa_yIn_{1-x-y}P$ light-emitting layer, the $Al_xGa_yIn_{1-x-y}P$ intermediate layer, and the $Al_xGa_yIn_{1-x-y}P$ current diffusion layer by about 4 μm or more.

As described above, according to a method for producing an LED of the present invention, it is possible to produce an LED with high luminance, improved reliability, and an outstanding efficiency.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a light-emitting diode, comprising the steps of:

forming a single-layered or multi-layered $Al_xGa_yIn_{1-x-y}P$ ($0 \leq x \leq 1$, $0 \leq y \leq 1$) light-emitting layer, an $Al_xGa_yIn_{1-x-y}P$ ($0 \leq x \leq 1$, $0 \leq y \leq 1$) intermediate layer of a second conductivity type, and an $Al_xGa_yIn_{1-x-y}P$ ($0 \leq x \leq 1$, $0 \leq y \leq 1$) current diffusion layer of a second conductivity type on a GaAs substrate of a first conductivity type;

forming a first electrode of a first conductivity type and a second electrode of a second conductivity type so as to contact the GaAs substrate and the current diffusion layer, respectively;

forming a protection film on exposed surfaces of the current diffusion layer and the second electrode;

forming grooves by dicing so as to interpose the second electrode and to reach the GaAs substrate;

etching the light-emitting layer, the intermediate layer, and the current diffusion layer by 4 $\mu$m or more with a bromine-type etchant from positions each facing the grooves in a direction parallel to a surface of the substrate so as not to reach an end portion of each of the adjacent second electrodes; and removing the protection film formed on the current diffusion layer and the second electrode.

2. A method for producing a light-emitting diode according to claim 1, wherein the current diffusion layer is made of GaP.

3. A method for producing a light-emitting diode according to claim 1, a multi-layered reflecting film is provided between the GaAs substrate and the single-layered or multi-layered $Al_xGa_yIn_{1-x-y}P$ light-emitting layer.

4. A method for producing a light-emitting diode according claim 1, wherein the bromine-type etchant is a mixture containing a bromine aqueous solution and phosphoric acid.

5. A method for producing a light-emitting diode according to claim 1, wherein a diced width of each of the grooves formed in the dicing step is equal to or greater than about 50 $\mu$m.

* * * * *